United States Patent [19]

Okunuki et al.

[11] Patent Number: 4,825,082
[45] Date of Patent: Apr. 25, 1989

[54] ELECTRON EMITTING APPARATUS

[75] Inventors: Masahiko Okunuki, Tokyo; Takeo Tsukamoto, Atsugi; Akira Shimizu, Sagamihara; Akira Suzuki, Yokohama; Masao Sugata, Yokohama; Isamu Shimoda, Zama, all of Japan

[73] Assignee: Canon Kabushiki Kaisha, Tokyo, Japan

[21] Appl. No.: 60,238

[22] Filed: Jun. 11, 1987

[30] Foreign Application Priority Data

Jun. 19, 1986 [JP] Japan ................................ 61-141389

[51] Int. Cl.$^4$ ............................................ H01J 27/00
[52] U.S. Cl. ............................. 250/423 F; 250/492.2; 250/492.3
[58] Field of Search ............... 250/423 F, 423 R, 424, 250/427, 492.2, 492.3

[56] References Cited

U.S. PATENT DOCUMENTS 4,418,283  11/1983  Trotel ............................. 250/492.21
4,746,587  5/1988  Nicholas ....................... 250/492.3 X

*Primary Examiner*—Steven Mottola
*Attorney, Agent, or Firm*—Fitzpatrick, Cella, Harper & Scinto

[57] ABSTRACT

An electron emitting apparatus comprising a plurality of electron emitting devices having an elongated electron emitting pattern which extends in a first direction. The adjacent electron emitting devices are arranged so as to be deviated in a second direction which crosses the first direction.

3 Claims, 3 Drawing Sheets

ELECTRON EMITTING APPARATUS

BACKGROUND OF THE INVENTION

1. Field of the Invention

The present invention relates to an electron emitting apparatus and, more particularly, to an electron emitting apparatus in which the electron emission is induced by applying a voltage. Such an electron emitting apparatus is preferably used as an electron beam generating source of an electron beam applied apparatus such as, e.g., an electron beam exposing apparatus or the like.

2. Related Background Art

Hitherto, the thermion emission from a hot cathode has been used as an electron generating source. Such an electron emission using the hot cathode has problems such that the amount of energy loss by the heating is large, it is necessary to form the heating means, it takes a long time to preheat, and the system is likely to become unstable by the heat.

To solve these problems, the electron emitting device without the aid of the heating has been studied and several types of devices have been proposed.

For example, the following devices have been proposed: a device of the type such that an avalanche breakdown phenomenon is caused by applying a reverse bias voltage to the PN junction, thereby emitting the electrons to the outside of the device; a device of the (MIM) type such that it has a structure of metal-insulating material layer-metal layer and by applying a voltage between both metals, the electrons passed through the insulating material layer are emitted from the metal layer to the outside of the device by the tunnel effect; a device of the surface conductivity type such that by applying a voltage to a high resistance thin film in the direction perpendicular to the direction of film thickness, the electrons are emitted from the surface of the thin film to the outside of the device; a device of the field effect (FE) type such that by applying a voltage to the metal having such a shape that the field concentration easily occurs, the electric field of a high density is locally generated, thereby emitting the electrons from the metal to the outside of the device; and the like.

As an example of application of those electron emitting devices, there is considered a method whereby an electron emitting apparatus is constituted by arranging a plurality of electron emitting devices and the ON-OFF operation of the emission of the electrons from each device is controlled, thereby allowing the electrons to be emitted like a desired pattern and to collide with the surface of a workpiece, and thereby working the surface or changing the surface quality by the exposure of an electron beam.

As the foregoing electron emitting apparatus, there is considered an apparatus in which electron emitting devices are two-dimensionally arranged. According to such an electron emitting apparatus, the workpiece is merely arranged to face this apparatus and each electron emitting device is ON-OFF controlled in this state, thereby enabling the electron beam exposure of the surface of the workpiece to be performed like a two-dimensional pattern.

However, in the foregoing electron emitting apparatus, it is difficult to use the whole surface of the electron emitting device in order to emit the electrons because of the constitution of each device. Therefore, the two-dimensional pattern for the emission of the electrons is a dot matrix pattern in which a space exists between dots and there is a drawback such that a continuous pattern cannot be formed.

SUMMARY OF THE INVENTION

It is a main object of the present invention to provide an electron emitting apparatus which can solve the foregoing problems in the conventional techniques.

Another object of the invention is to provide an electron emitting apparatus which can perform an electron emitting apparatus which can perform an electron beam exposure of a continuous pattern.

Still another object of the invention is to provide an electron emitting apparatus having a plurality of electron emitting devices having an elongated electron emitting pattern which extends in the first direction, wherein the adjacent devices are arranged in the second deviated direction which crosses the first direction.

DETAILED DESCRIPTION OF PREFERRED EMBODIMENTS

A practical embodiment of the present invention will be described hereinbelow with reference to the drawings.

Figure 1A:
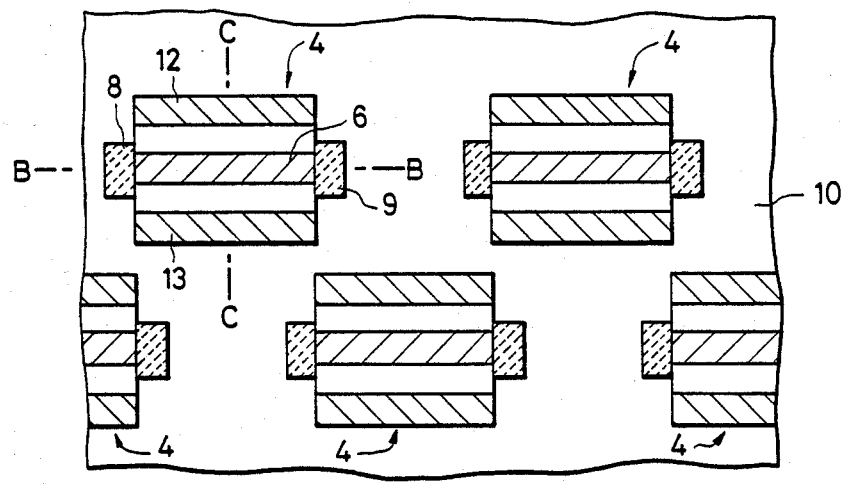
Fig. 1A is a partial plan view of an electron emitting apparatus of an embodiment of the present invention.
Figure 1B:
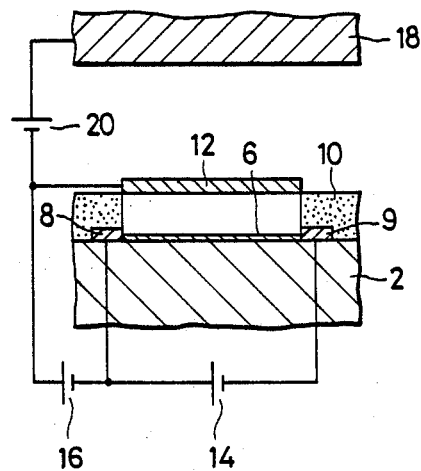
FIGS. 1B and 1C show cross sectional views taken along the lines B—B and C—C in FIG. 1A, respectively.
Figure 1C:
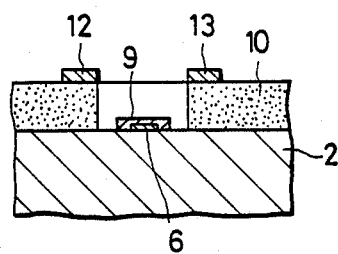

FIG. 1A is a partial plan view showing an embodiment of an electron emitting apparatus according to the present invention. FIGS. 1B and 1C are cross sectional views taken along the lines B—B and C—C in FIG. 1A, respectively.

In FIG. 1, an insulating substrate 2 is made of, e.g., glass, ceramics, crystal, or the like. A number of electron emitting devices 4 of the surface conductivity type are arranged on the substrate 2.

Each electron emitting device 4 has a high resistance thin film 6 and electrodes 8 and 9 formed on the substrate 2. The high resistance thin film 6 is formed by, for example, causing a film breakdown by supplying a current at a high temperature to a metal thin film such as Pt, Au, Mo, C, Pd, etc., or to a metal oxide thin film such as $SnO_2$, $In_2O_3$, Tio, etc. The thin film 6 has a thickness of, e.g., about 100 to 10000 Å and has a resistance of, e.g., about a few kiloohms to hundreds of megaohms. As shown in the diagrams, the film 6 has an elongated shape in the B—B direction and electrodes 8 and 9 are connected to both ends of the film 6. These electrodes are general thin film electrodes formed of a metal such as, e.g., Pt, Au, Ag, or the like.

An insulating layer 10 is formed on the substrate 2 so as to also cover the electrodes 8 and 9 excluding the portions over the film 6. This insulating layer is formed of, e.g., $SiO_2$, SiN, $Si_3N_4$, $Al_2O_3$, AlN, BN, or the like.

Lead-out electrodes 12 and 13 are arranged on the insulating layer 10 in parallel with both sides of the film 6 at the positions adjacent to the film 6. The lead-out electrodes are also formed of a material similar to the electrodes 8 and 9.

As shown in FIG. 1B, a power source 14 is connected between the electrodes 8 and 9 in order to apply a voltage such as to set the voltage of the side of the electrode 8 to become positive. A power source 16 is connected between the electrode 8 and the electrodes 12 and 13 in order to apply a voltage such as to set the voltages on the sides of the lead-out electrodes 12 and 13 to become positive.

FIG. 1B also shows an arrangement of a workpiece in the use state of the apparatus of the embodiment. In FIG. 1B, reference numeral 18 denotes a workpiece such as, e.g., a silicon wafer. This wafer is disposed in parallel with the substrate 2. A power source 20 is connected between the wafer and the lead-out electrodes 12 and 13 in order to apply a voltage such as to set the voltage on the side of the wafer 18 to become positive.

In the foregoing apparatus of the embodiment, by applying a voltage (of, e.g., a few volts to a few kilovolts) higher than a threshold voltage between the electrodes 8 and 9 by the power source 14, the electrons are emitted from the film 6. The emitted electrons are upwardly pulled out by the lead-out electrodes 12 and 13. Since the wafer 18 is set to a higher voltage, the electrons are further accelerated and collide with the wafer surface. In this manner, the electron beam exposure is performed.

As shown in FIG. 1A, the electron emitting devices 4 are arranged at intervals in two lines in the direction B—B. The device arrangement pitch of each line is twice as large as the length of the film 6. In two lines, the devices are alternately arranged (like a zigzag shape) in a manner such that the high resistance thin films 6 of the respective devices do not overlap and no gap exists between two films 6 with respect to the direction C—C. Further, the arrangement pitch of the films 6 between two lines is set to be equal to the length of the thin film.

In the apparatus of the embodiment, the emission of the electrons from each electron emitting device 4 can be independently realized by controlling the vottage of the power source 14. Namely, by setting the voltage of the power source 14 to a value above the threshold value, the electrons are emitted. By setting the voltage of the power source to a value below the threshold value (for example, by cutting off the power supply by turning off the switch), the emission of the electrons is stopped. In the apparatus of the embodiment, an electron emitting pattern from the electron emitting device 4 is an elongated pattern corresponding to the shape of the film 6.

When using the apparatus of the embodiment as mentioned above, the electrons are emitted at a proper tim from the desired electron emitting device 4 while relatively moving the wafer 18 in the direction C—C. Thus, the electron beam can be exposed to the wafer 18 in a desired two-dimensional pattern shape.

Figure 2A:
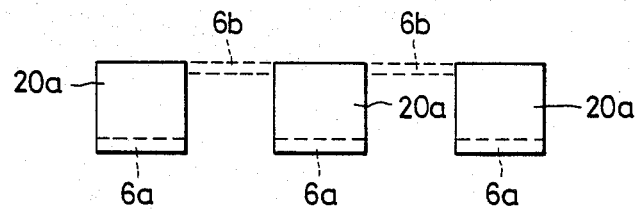
FIGS. 2A and 2B are diagrammatical views showing pattern exposing processes.
Figure 2B:
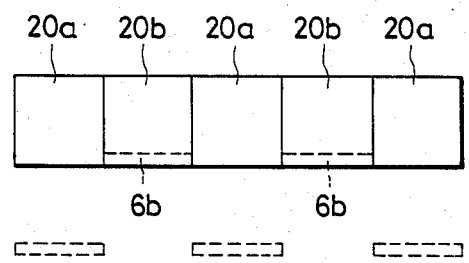

FIGS. 2A and 2B are diagrammatical views showing an example of the foregoing pattern exposing processes.

In the diagrams, reference numeral 6a denotes a portion corresponding to the film 6 of the device 4 of the lower line in FIG. 1A, and 6b indicates a portion corresponding to the film 6 of the device of the upper line in FIG. 1A. It is assumed that the wafer 18 is moved from the lower portion to the upper portion in FIGS. 2A and 2B. First, the wafer 8 is moved in the direction C—C by the distance of only the arrangement pitch between the high resistance thin films of two lines while emitting the electrons from all of the devices 4 of the lower line. Thus, a region 20a shown in FIG. 2A is exposed. Next, the emission of the electrons from all of the devices 4 of the lower line is stopped and at the same time, the wafer 18 is similarly moved in the direction C—C by the distance of only the arrangement pitch of the high resistance thin films of two lines while emitting the electrons from all of the devices 4 of the upper line. Thus, a region 20b shown in FIG. 2B is exposed. In this manner, the linear exposure portion which extends in the direction B—B is formed on the wafer 18.

To form the linear exposure portion which extends in the direction C—C on the wafer 18, it is sufficient to move the wafer by a desired distance in the direction C—C while emitting the electrons from a desired electron emitting device 4.

Figure 3:
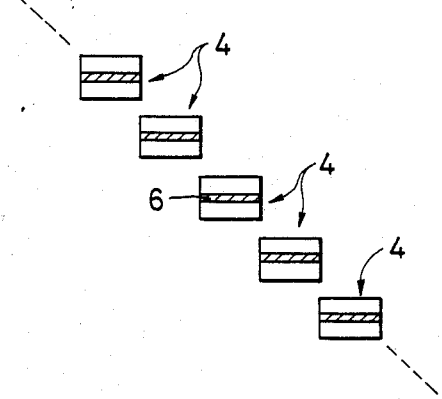
FIG. 3 is a plan view showing an arrangement of electron emitting devices.

FIG. 3 is a plan view showing another example of an arrangement of electron emitting devices of an electron emitting apparatus according to the invention. The electron emitting devices 4 are obliquely arranged like a stairway in the longitudinal direction of the high resistance thin film 6. In the case of this embodiment, a two-dimensional pattern exposure can be performed similarly to the case of the zigzag pattern arrangement.

On the other hand, it is also possible to use an arrangement such that the foregoing stairway pattern arrangement and zigzag pattern arrangement are properly mixed.

In the foregoing embodiment, the electron emitting devices of the surface conductivity type have been used. However, the invention can be also applied to the case of the electron emitting devices of, e.g., the PN junction type, MIM type, or the like.

Figure 4A:
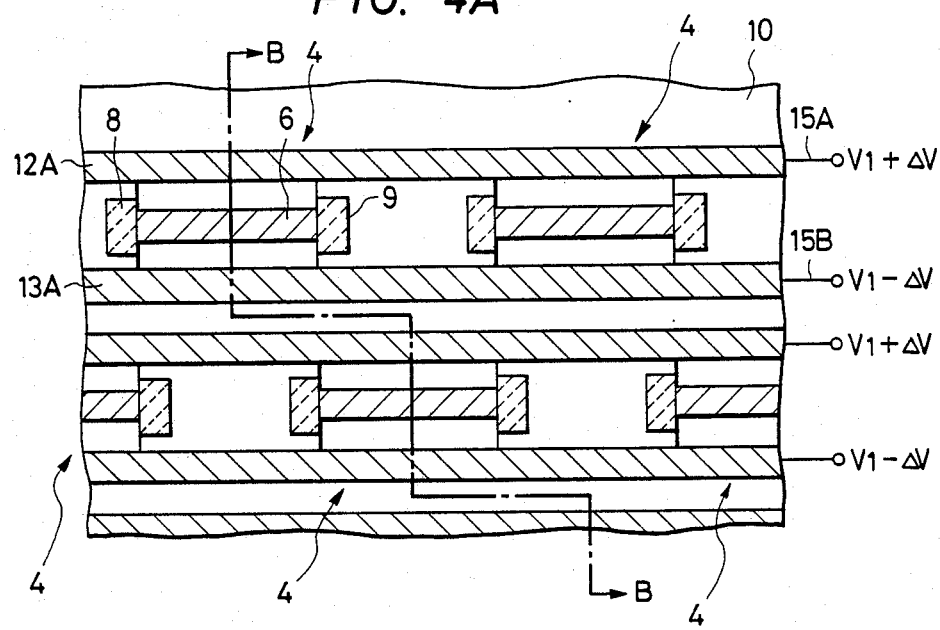
FIG. 4A is a partial plan view of an electron emitting apparatus in another embodiment of the present invention.
Figure 4B:
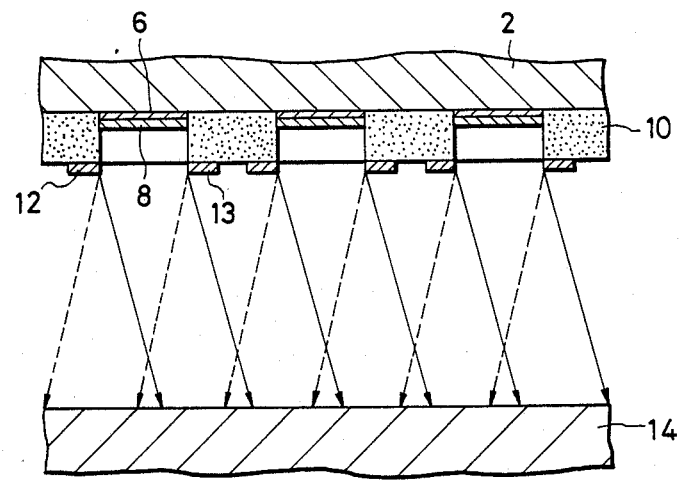
FIG. 4B is a diagram showing an example in which a pattern is exposed on the surface of a workpiece using the electron emitting apparatus shown in FIG. 4A.

FIGS. 4A and 4B show an example in which there is no need to scan the surface of a workpiece as described in the foregoing example and a pattern exposure which is equivalent to the case where the scan was performed can be accomplished.

FIG. 4A is a diagram corresponding to FIG. 1A. In FIG. 4A, the same parts and components as those shown in FIG. 1A are designated by the same reference numerals.

FIG. 4B shows an example in the case of exposing a pattern on the surface of a workpiece using the electron emitting apparatus shown in FIG. 4A.

The electron emitting apparatus shown in FIGS. 4A and 4B is essentially the same as that shown in FIGS. 1A to 1C except that the apparatus of FIGS. 4A and 4B has deflecting means for deflecting the electron beam.

The deflecting means comprises deflecting electrodes 12A and 13A. A voltage $V_1$ is applied from a power source (not shown) to the deflecting electrodes 12A and 13A through lead-out electrodes 15A and 15B in order to lead out the electron beams, respectively. Further, an AC voltage of $\pm \Delta V$ is applied from a power source (not shown) in order to deflect the electron beams.

Therefore, the AC voltage of $V_1 \pm \Delta V$ is applied to the electrodes 12A and 13A, so that the electron beams can be deflected and a pattern exposure similar to that of the scanning type apparatus can be executed. Namely, as shown in FIG. 4B, the space portions among the electron emitting devices arranged like a zigzag lattice can be also exposed by the deflection of the electron beams emitted.

As described above, according to the embodiment, by emitting the electrons at a proper time from a desired electron emitting device while relatively moving the workpiece, the electron beam exposure of a continuous two-dimensional pattern can be performed.

We claim:

1. An electron emitting apparatus comprising a plurality of electron emitting devices each having an electron emitting portion having an elongated configuration in a first direction, wherein said electron emitting portions are arranged so that said portions adjacent to each other are diviated in a second direction, such that in a scanning direction substantially no gap exists between said adjacent electron emitting portions.

2. An electron emitting apparatus according to claim 1, wherein said adjacent electron emitting portions are alternately arranged in a zigzag pattern.

3. An electron emitting apparatus according to claim 1, further having deflecting means for deflecting the electrons emitted.

* * * * *

UNITED STATES PATENT AND TRADEMARK OFFICE
CERTIFICATE OF CORRECTION

PATENT NO. : 4,825,082
DATED : April 25, 1989
INVENTOR(S) : MASAHIKO OKUNUKI, ET AL.

It is certified that error appears in the above-identified patent and that said Letters Patent is hereby corrected as shown below:

COLUMN 2

Line 10, "emitting apparatus which can perform an electron" should be deleted.
    Line 57. "Tio," should read --TiO,--.

COLUMN 3

Line 45, "vottage" should read --voltage--.
    Line 57, "tim" should read --time--.

COLUMN 4

Line 2, "wafer 8" should read --wafer 18--.

COLUMN 6

Line 1, "diviated" should read --deviated--.

Signed and Sealed this

Twentieth Day of February, 1990

*Attest:*

JEFFREY M. SAMUELS

*Attesting Officer*    *Acting Commissioner of Patents and Trademarks*